United States Patent [19]
Panchou et al.

[11] Patent Number: 6,040,630
[45] Date of Patent: Mar. 21, 2000

[54] INTEGRATED CIRCUIT PACKAGE FOR FLIP CHIP WITH ALIGNMENT PREFORM FEATURE AND METHOD OF FORMING SAME

[75] Inventors: Karen A. Panchou, Grant; Charles M. Newton, Palm Bay; Charles D. Rosier, Indialantic, all of Fla.

[73] Assignee: Harris Corporation, Palm Bay, Fla.

[21] Appl. No.: 09/059,163

[22] Filed: Apr. 13, 1998

[51] Int. Cl.[7] .............................. H01L 23/48; H01L 23/52; H01L 29/40
[52] U.S. Cl. .......................... 257/783; 201/782; 201/780
[58] Field of Search ................... 201/779, 782, 201/783, 780, 781, 787

[56] References Cited

U.S. PATENT DOCUMENTS

| | | |
|---|---|---|
| 5,039,628 | 8/1991 | Carey . |
| 5,111,279 | 5/1992 | Pasch et al. . |
| 5,168,346 | 12/1992 | Pasch et al. . |
| 5,196,726 | 3/1993 | Nishiguchi et al. . |
| 5,214,308 | 5/1993 | Nishiguchi et al. . |
| 5,258,648 | 11/1993 | Lin . |
| 5,347,162 | 9/1994 | Pasch . |
| 5,349,490 | 9/1994 | Kato et al. . |
| 5,352,926 | 10/1994 | Andrews .................. 257/778 |
| 5,363,277 | 11/1994 | Tanaka ..................... 257/783 |
| 5,468,681 | 11/1995 | Pasch . |
| 5,489,804 | 2/1996 | Pasch . |
| 5,569,963 | 10/1996 | Rostoker et al. . |
| 5,814,890 | 9/1998 | Iwasaki ..................... 257/778 |
| 5,880,530 | 3/1999 | Mashimoto et al. ..... 257/783 |

FOREIGN PATENT DOCUMENTS 0 186 818 A2  12/1985  European Pat. Off. ........ H01L 23/48

*Primary Examiner*—Sheila V. Clark
*Attorney, Agent, or Firm*—Allen, Dyer, Doppelt, Milbrath & Gilchrist, P.A.

[57] ABSTRACT

An integrated circuit package includes a substrate having a circuitry pattern formed on the substrate. A thermoplastic attachment film is positioned on the substrate and has vias that expose the circuitry pattern. A flip chip has input/output contacts formed as conductive bumps and mounted on the thermoplastic attachment film such that the conductive bumps are received within the cut openings and engage the circuitry pattern. The thermoplastic attachment film forms an underfill and a thermoplastic bond between the substrate and the flip chip, which allows ready removal of the flip chip upon application of heat. A method is also disclosed forming the integrated circuit package using the flip chip, thermoplastic attachment film and substrate of the present invention.

14 Claims, 3 Drawing Sheets

TO OVEN

INTEGRATED CIRCUIT PACKAGE FOR FLIP CHIP WITH ALIGNMENT PREFORM FEATURE AND METHOD OF FORMING SAME

FIELD OF THE INVENTION

This invention relates to an integrated circuit package for flip chips, and more particularly, to an integrated circuit package that aligns a flip chip and a method of forming same.

BACKGROUND OF THE INVENTION

Large scale integrated circuit chips have many input and output connections. In order to accommodate the many connections, manufacturers have produced leadless chip carriers that use a wire bonding process. However, a wire bonding process can be expensive. In order to reduce the complexity and expense of a wire bonding process, manufacturers have increasingly used flip chip technology.

In a flip chip, an integrated circuit carries a pad arrangement on the top surface and is turned upside down (i.e., flipped), thus allowing direct coupling between the pads and matching contacts on the main circuit board or chip carrier. In many typical flip chip circuits, solder or gold bumps are formed on the integrated circuit input/output terminals. The flip chip is directly bonded to a chip carrier or other structure by a solder connection. The input/output pattern that has the soldered or other formed conductive bumps is known as the chip footprint, and is typically designed from the particular design criteria used by one skilled in the art for creating the chip surface connection on the chip itself.

Typically, the flip chip is placed onto a substrate using expensive "pick-in-place" techniques, such as by using a flip chip die bonder. The flip chips are expensive and often the conductive bumps formed at the appropriate input/output contacts are very small and require expensive and complex placement techniques. Additionally, even after the flip chip is placed in its proper position, and the conductive bumps formed as solder or gold/epoxy are in their proper position, the flip chip typically forms a permanent bond with the substrate, making subsequent flip chip removal difficult. This permanent bond is sometimes the result of an underfill that fills the space under the flip chip. The permanent bond could also be the result of solder forming the conductive bumps engaging the substrate. However, often, the flip chip has to be readily removed for replacement with upgrades and/or replacement chips, especially if the original flip chip has become damaged. Even if the flip chip could be readily removed, expensive placement techniques would have to be used.

Some prior art techniques provide alignment features for various flip chip circuits. However, some of these techniques are expensive, complicated, or still require complicated placement techniques. Some of the techniques also make permanent or semi-permanent attachments that make flip chip removal difficult. Examples of such placement and flip chip mounting techniques include EP Patent No. 186,818, which discloses an insulator having holes arranged in a pattern corresponding to that of the contacts, which is placed between a chip and leads for easy alignment. Other U.S. Patents disclose various interposers or spacers for aligning chips such as disclosed in U.S. Pat. Nos. 5,111,279; 5,168,346; 5,347,162; 5,468,681; and 5,489,804, all to Pasch or Pasch, et al.

SUMMARY OF THE INVENTION

It is, therefore, an object of the present invention to provide an integrated circuit package and method of forming same that allows flip chip packaging where the flip chip can be readily aligned with the circuitry pattern on a substrate without using expensive "pick-in-place" techniques or flip chip die bonders.

It is still another object of the present invention to provide an integrated circuit package for flip chips where the flip chip can be secured in place for allowing contact between the conductive bumps on a flip chip and the circuitry pattern on a substrate, but also allow ready removal of the flip chip.

It is still another object of the present invention to provide an integrated circuit package for flip chips, where the flip chip can be secured for ready removal without requiring a permanently bonding underfill.

The present invention now provides an integrated circuit package that allows a flip chip having input/output contacts formed as conductive bumps to be aligned accurately such that the conductive bumps engage the circuitry pattern in the desired configuration. The present invention also allows the flip chip to be secured such that the conductive bumps remain in contact with the circuitry pattern. The flip chip is readily placed in its proper position by means of a thermoplastic attachment film positioned on the substrate and having vias that expose the circuitry pattern. The thermoplastic attachment film forms a socket-type arrangement where the conductive bumps are received within the vias formed in the thermoplastic attachment film. The attachment film also provides a thermoplastic bond between the flip chip and the substrate which, upon heating thereof, allows the flip hip to be removed.

In accordance with the present invention, the integrated circuit package comprises a substrate with a circuitry pattern formed on the substrate. A thermoplastic attachment film is positioned on the substrate and has vias that expose the circuitry pattern. A flip chip has input/output contacts formed as conductive bumps and mounted on the thermoplastic attachment film, such that the conductive bumps are received within the cut openings and engage the circuitry pattern. Upon heating of a thermoplastic attachment film, a thermoplastic bond is formed between the substrate and the flip chip. Upon application of heat to the integrated circuit package, the flip chip can be removed.

In accordance with one aspect of the present invention, the circuitry pattern comprises bond pads for engaging the conductive bumps on the flip chip. The thermoplastic attachment film exposes the bond pads. The vias are formed as cut openings, such as by laser drilling the vias to the proper dimension for receiving the conductive bumps. In still another aspect of the present invention, the conductive bumps can be formed of gold or an epoxy that has been impregnated with a conductive material. The conductive bumps can also be formed from a thermoplastic resin or a thermoplastic paste that could be screen-printed onto the flip chip at the input/output contacts. When the conductive bumps are formed from such a thermoplastic paste or resin, the thermoplastic is typically impregnated with a silver or other conductive material to allow the thermoplastic to conduct current as necessary for the structure.

The thermoplastic also aids in forming a bond between the flip chip and the circuit pattern and/or the bond pads. This structure creates an even greater bond that is rigid under stress conditions. The thermoplastic bond with the attachment film and the conductive thermoplastic bumps is broken upon application of heat to a temperature sufficient for making the thermoplastic attachment film and conductive thermoplastic bumps pliable enough to allow flip chip removal.

In still another aspect of the present invention, the thermoplastic attachment film is typically about two mils thick, and the conductive bumps are about three mils thick to allow some compression of the conductive bumps to aid in securing the flip chip, thermoplastic attachment film and substrate together. The substrate can be formed from a six ohm substrate or initially formed from a green tape ceramic substrate.

In accordance with a method aspect of the present invention, the method for forming an integrated circuit package of the present invention comprises the steps of forming a substrate having a circuitry pattern thereon. A thermoplastic attachment film is positioned on the substrate. The attachment film has been precut to fit over the substrate and, typically, the vias have been cut by means such as a laser, a drill or other means known to those skilled in the art. The vias expose the circuitry pattern formed on the substrate.

The method further comprises the step of mounting a flip chip on the thermoplastic attachment film, wherein the flip chip includes input/output contacts formed as conductive bumps that are received within the vias of the attachment film to engage the circuitry pattern. The substrate, thermoplastic attachment film and flip chip are heated together to a temperature sufficient to form a thermoplastic bond between the substrate, thermoplastic attachment film and the flip chip.

The method further comprises the steps of applying heat to soften the thermoplastic attachment film and removing the flip chip, such as for replacement and/or upgrade. The method can further comprise the steps of forming bond pads on the circuitry pattern before placement of the thermoplastic attachment film. The bond pads engage the conductive bumps on the flip chip and expose the bond pads by the vias. The vias can also be formed by laser drilling cut openings into the thermoplastic attachment film. The method can further comprise the steps of forming the conductive bumps from gold and forming the conductive bumps from an epoxy that has been impregnated with a conductive material.

In still another aspect of the present invention, the method comprises the step of forming the conductive bumps from a thermoplastic resin or from a thermoplastic paste, including the step of screen-printing the conductive bumps onto the flip chip at the input/output contacts.

The method further comprises the step of forming the thermoplastic attachment film from a plastic film that is about two mils thick and forming the conductive bumps to be about three mils thick such that the conductive bumps will engage the circuitry pattern and bond pads on the substrate.

The method further comprises the step of forming the substrate from a six ohm substrate and forming the substrate from a green tape ceramic.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
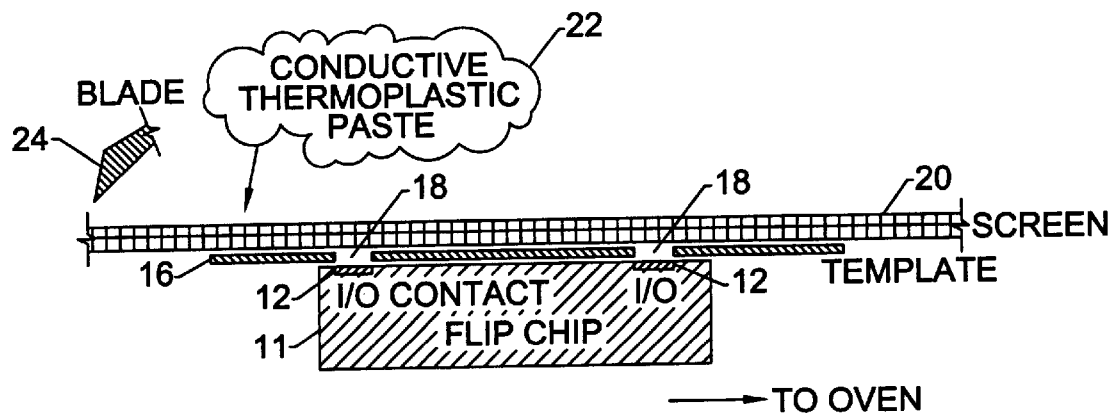
FIG. 1 is a schematic diagram of a flip chip die showing the screen printing of conductive thermoplastic bumps onto the input/output contacts of the flip chip.

Referring now to the drawings, and more particularly to FIG. 1, there is illustrated a flip chip integrated circuit die in accordance with the present invention to form the integrated circuit package 10 (FIG. 4a) of the present invention. As illustrated, the flip chip integrated circuit die 11 (hereinafter referred to as flip chip) includes input/output contacts 12 that form the footprint (or contact configuration) that is designed by one skilled in the art to the desired circuitry pattern that is formed on the desired substrate.

FIG. 1 illustrates a method of screenprinting conductive bumps 14 onto the flip chip 11 at the appropriate areas corresponding to the input/output contacts 12. The conductive bumps 14 can be formed of many different types of materials. FIG. 1 illustrates a preferred technique where conductive thermoplastic bumps 14 are formed.

The conductive thermoplastic bumps 14 are typically formed to be about three mils thickness, but naturally can vary in thickness depending on the thickness of a thermoplastic attachment film and the end use of the flip chip 11. It is also possible to form the conductive bumps from an epoxy that has been impregnated with a conductive material, as well as a gold bump that is formed on the input/output contacts to form a gold conductive bump. However, in accordance with the present invention, the conductive thermoplastic bumps are preferred in order to allow the formation of a more secure thermoplastic bond between the conductive thermoplastic bumps and a circuitry pattern and bond pads formed on a substrate. The conductive thermoplastic bumps also aid in allowing ready removal of the flip chip 11 on application of heat as will be described below.

As shown in FIG. 1, a template 16 can be applied over the flip chip 11. The template 16 includes openings 18 corresponding to the areas where the conductive bumps are to be formed. A screen 20, as conventional, and known to those skilled in the art, is placed over the template 16. Conductive thermoplastic paste 22 (or other type of conductive thermoplastic resin) is placed over the screen 20, which is wiped with blade 24 to force the paste 22 through the screen 20 and template 16 onto the flip chip input/output contacts 12, forming the desired conductive bumps 14. The thermoplastic paste can be formed from various thermoplastic resins as known to those skilled in the art, and can have silver powder or other conductive material placed therein for imparting the desired conductivity.

Figure 2:
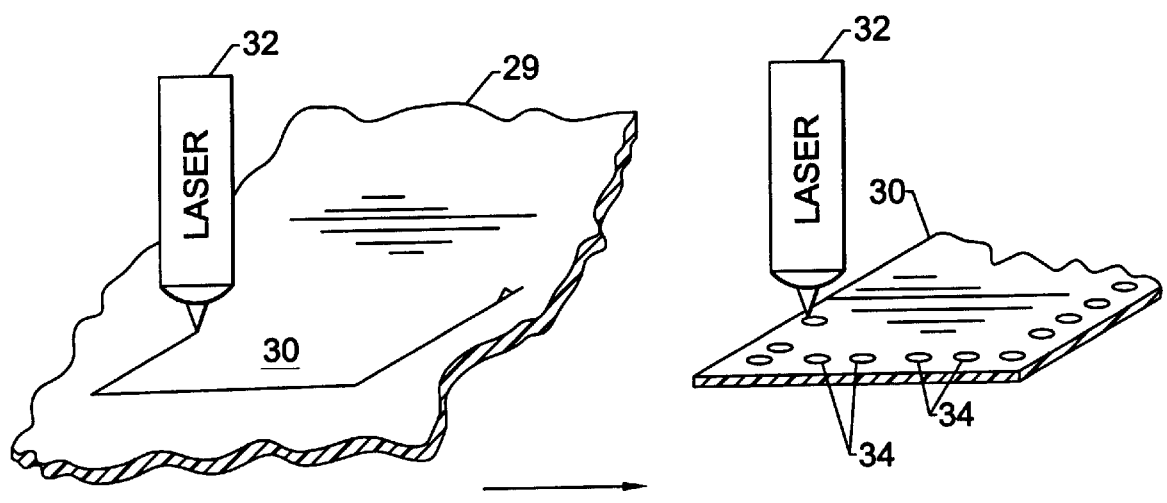
FIG. 2 is a plan view of a plastic film that has been laser cut to form a thermoplastic attachment film with appropriate vias.
Figure 3:
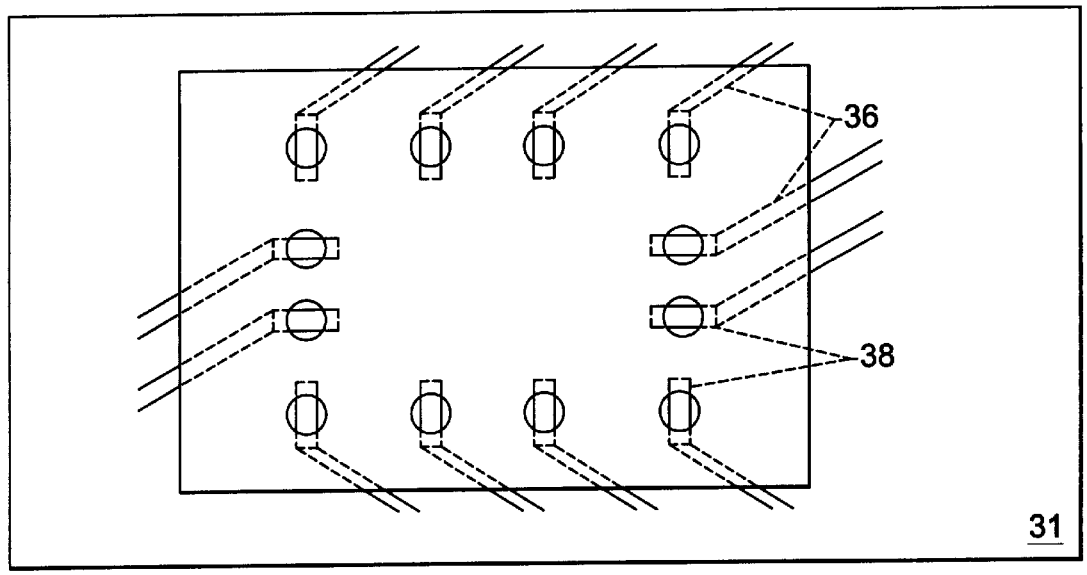
FIG. 3 is a schematic plan view of a ceramic substrate showing a circuitry pattern formed thereon and the thermoplastic attachment film of FIG. 2 positioned thereon to expose the circuitry pattern by the vias.

As shown in FIGS. 2 and 3, a thermoplastic film 29 is cut to a desired pattern (such as rectangular) to form a thermoplastic attachment film 30 of desired size to be placed on a substrate 31. Typically, a laser 32 has been found adequate for cutting the thermoplastic attachment film 30 to the desired size. The thermoplastic attachment film 30 can be formed from many different non-conductive thermoplastic attachment films, and can include a film formed from polyamide, as well as different types of polyethylene films.

Typically, the thermoplastic attachment film 30 is about two mils in thickness, but can range in thickness depending on the end use of the flip chip 11. As better shown in FIG. 2, a laser 32 is used to cut the vias 34 or holes in the thermoplastic attachment film 30 that correspond to the layout of the circuitry pattern 36 and bond pads 38 formed on the substrate 31, such as by screen-printing. The formed vias 34 will be just large enough to accept the conductive thermoplastic bumps 14. Because the conductive thermoplastic bumps are typically slightly larger (3 mils) than the thermoplastic attachment film 30 (2 mils), the conductive thermoplastic bumps are slightly compressed when the flip chip is received onto he film 30 and over substrate, imparting strength to any thermoplastic bond. The thermoplastic attachment film 30 also forms an underfill for the flip chip.

The substrate 31 can be formed from a ceramic substrate initially in its green state or a six ohm substrate. Typically, a green tape ceramic substrate is used and a sufficient number of green tape sheets are stacked to form the desired substrate 31. The circuitry pattern 36 is formed on the green tape ceramic substrate by methods known to those skilled in the art including screening. The circuitry pattern 36 includes bond pads 38 or metallic contacts that correspond to the contact points for engaging the conductive bumps formed on the flip chip 11.

Figure 4:
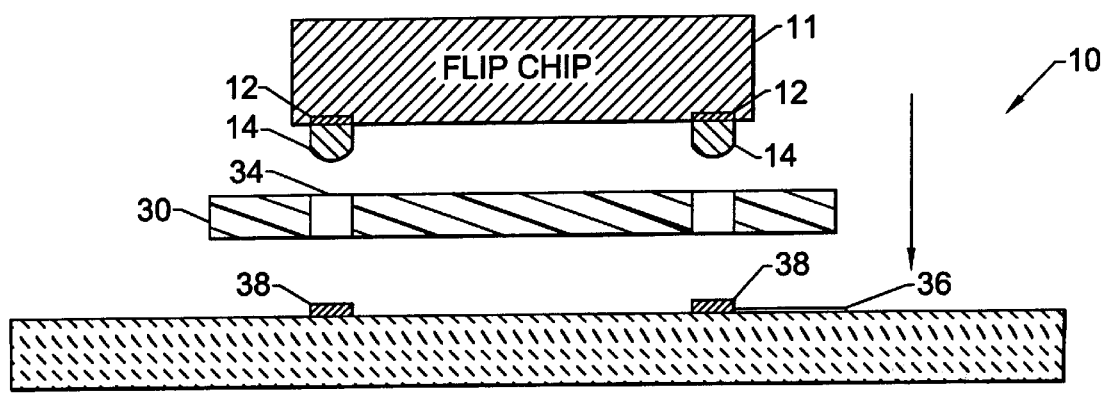
FIG. 4 is a side sectional view in exploded format showing the flip chip, thermoplastic attachment film and substrate and the relative relation between those components.
Figure 4A:
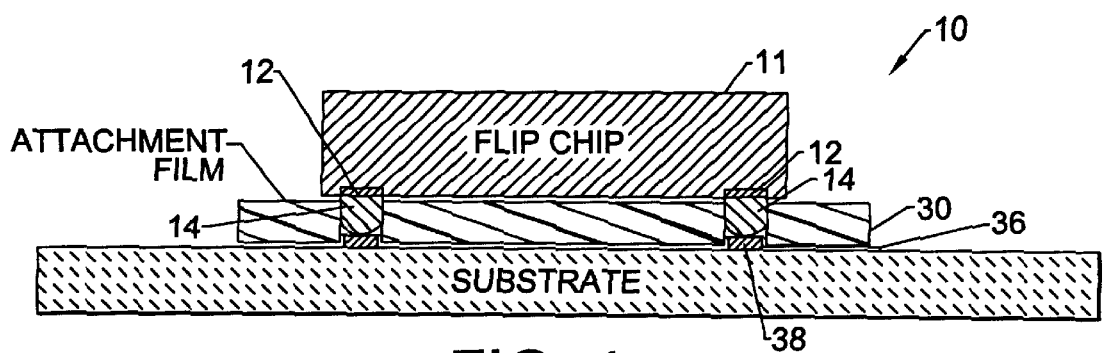
FIG. 4a is a side sectional view of the completed integrated circuit package.

The thermoplastic attachment film 30 is then positioned over the substrate 31 and positioned so that the vias expose the bond pads 38. The flip chip 11, with the screen-printed conductive thermoplastic bumps 14, and the substrate 31 with thermoplastic attachment film 30, can both be placed in an oven, either simultaneously or at different times. The oven is heated to a temperature sufficient to make the thermoplastic conductive bumps and thermoplastic attachment film tacky and, thus, impart a thermoplastic bond. The conductive thermoplastic bumps are thus heated and thermoplastically set. The thermoplastic attachment film is also thermoplastically set to the substrate. The flip chip and substrate having attached thermoplastic attachment film are removed and cooled so that the conductive thermoplastic bumps are rigid. The thermoplastic attachment film is also secured in position to the substrate. As shown in FIG. 4, it is evident that the holes or vias 34 on the thermoplastic attachment film and the substrate surface form a socket arrangement (i.e., a preform) for receiving the conductive thermoplastic bumps 14 of the flip chip.

The substrate 31 can be placed under a conventional microscope and the flip chip 11 "flipped over." Using the conventional microscope to observe the flip chip 11, the flip chip is moved around on the thermoplastic attachment film 30 until the conductive bumps 14 fall into the holes forming the preform by means of a thermoplastic attachment film 30. The flip chip 11 is then weighted by means such as a clamp (or other means) and the entire product placed back into an oven where the temperature is elevated enough to allow the thermoplastic attachment film and conductive bumps to become "tacky," forming a thermoplastic bond between the substrate, thermoplastic attachment film forming the preform, and the flip chip. The thermoplastic attachment film 30 also forms a desired underfill for the flip chip imparting structural stability and reducing the chance of flip chip damage. The final product is then removed from the oven and allowed to cool, thus forming a thermoplastic bond that will retain the conductive bumps against the bond pads and the flip chip in a secure position.

When the flip chip has to be replaced, it is possible to place the final integrated circuit package back (FIG. 4a) into the oven where the product is elevated in temperature to allow the thermoplastic attachment film and the conductive bumps to become pliable enough to allow ready removal of the flip chip. The thermoplastic attachment film and substrate then can be allowed to cool and dry, thus permitting another flip chip to be placed onto the flip chip.

The present invention is advantageous because it allows flip chip placement onto a substrate without requiring extensive "pick-in-place" or flip chip die bonding techniques. The thermoplastic attachment film also provides a sufficient underfill to the flip chip. additionally, the flip chip can be readily removed upon the application of heat, which causes the thermoplastic attachment film to become pliable and the conductive thermoplastic bumps to be pliable enough to break the connection between the bond pads and the conductive thermoplastic bumps.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

What is claimed is:

1. An integrated circuit package comprising:
   a substrate;
   a circuitry pattern formed on the substrate;
   a thermoplastic attachment film positioned on the substrate and having vias that expose the circuitry pattern;
   a flip chip having input/output contacts formed as conductive thermoplastic bumps, wherein said flip chip is mounted on the thermoplastic attachment film such that the conductive thermoplastic bumps are received within the cut openings and engage the circuitry pattern, wherein the thermoplastic attachment film forms an underfill and the thermoplastic attachment film and conductive thermoplastic bumps form a thermoplastic bond between the substrate and the flip chip that allows ready removal of the flip chip upon application of heat when the thermoplastic attachment film and the thermoplastic conductive bumps become pliable and allow removal.

2. A package according to claim 1, wherein said circuitry pattern comprises bond pads for engaging the conductive thermoplastic bumps on the flip chip, wherein said thermoplastic attachment film exposes said bond pads.

3. A package according to claim 1, wherein said vias are formed as cut openings.

4. A package according to claim 1, wherein said conductive thermoplastic bumps are formed from a conductive thermoplastic paste.

5. A package according to claim 1, wherein said conductive thermoplastic bumps have been screen-printed onto the flip chip at input/output contacts.

6. A package according to claim 1, wherein said thermoplastic attachment film is about two mils thick.

7. A package according to claim 6, wherein said conductive thermoplastic bumps are about three mils thick.

8. A package according to claim 1, wherein said substrate is formed from a six ohm substrate.

9. A package according to claim 1, wherein said substrate is initially formed from a green tape ceramic.

10. An integrated circuit package comprising:
   a ceramic substrate;
   a circuitry pattern formed on the substrate, said circuitry pattern including bond pads for engaging input/output contacts on a flip chip;
   a thermoplastic attachment film positioned on the substrate and having cut openings that expose the bond pads;
   a flip chip having input/output contacts formed as conductive thermoplastic bumps, wherein said flip chip is mounted on the thermoplastic film such that the conductive thermoplastic bumps are received within the cut openings and engage the bond pads, wherein the thermoplastic attachment film forms an underfill and the thermoplastic attachment film and conductive thermoplastic bumps form a thermoplastic bond between the substrate and the flip chip, which allows ready removal of the flip chip upon application of heat when the thermoplastic attachment film and the thermoplastic conductive bumps become pliable and allow removal.

11. A package according to claim 10, wherein said conductive thermoplastic bumps are formed from a conductive thermoplastic paste.

12. A package according to claim 10, wherein said conductive thermoplastic bumps have been screen-printed onto the flip chip at input/output contacts.

13. A package according to claim 10, wherein said thermoplastic attachment film is about two mils thick.

14. A package according to claim 13, wherein said conductive thermoplastic bumps are about three mils thick.

* * * * *

UNITED STATES PATENT AND TRADEMARK OFFICE
CERTIFICATE OF CORRECTION

PATENT NO. : 6,040,630
DATED : March 21, 2000
INVENTOR(S) : Panchou, et. al.

It is certified that error appears in the above-identified patent and that said Letters Patent is hereby corrected as shown below:

Column 2, line 29    Delete:
"hip"

Substitute:
-- chip --

Column 5, line 22    Delete:
"onto he film"

Substitute:
-- onto the film --

Signed and Sealed this

Twenty-sixth Day of December, 2000

Attest:

Q. TODD DICKINSON

Attesting Officer                   Director of Patents and Trademarks